(12) United States Patent
Volk

(10) Patent No.: US 11,996,674 B2
(45) Date of Patent: May 28, 2024

(54) DRIVER CIRCUIT FOR LASER DIODES AND CIRCUIT ARRANGEMENT WITH SUCH A DRIVER CIRCUIT AND LASER DIODES

(71) Applicant: Hella GmbH & Co. KGaA, Lippstadt (DE)

(72) Inventor: Hans-Lothar Volk, Lippstadt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 814 days.

(21) Appl. No.: 17/053,014

(22) PCT Filed: May 18, 2018

(86) PCT No.: PCT/EP2018/063131
§ 371 (c)(1),
(2) Date: Nov. 4, 2020

(87) PCT Pub. No.: WO2019/219211
PCT Pub. Date: Nov. 21, 2019

(65) Prior Publication Data
US 2021/0111534 A1   Apr. 15, 2021

(51) Int. Cl.
*H01S 3/00* (2006.01)
*H01S 5/042* (2006.01)
(Continued)

(52) U.S. Cl.
CPC .......... *H01S 5/0428* (2013.01); *H01S 5/4025* (2013.01); *H01S 5/068* (2013.01)

(58) Field of Classification Search
CPC ....... H01S 5/0428; H01S 5/4025; H01S 5/068
See application file for complete search history.

(56) References Cited

U.S. PATENT DOCUMENTS 5,394,415 A * 2/1995 Zucker .................... H01S 3/115
372/38.03
5,852,358 A * 12/1998 Ehsani .................... H05B 41/30
323/240

(Continued)

FOREIGN PATENT DOCUMENTS

CN      106549301 A     3/2017
EP        1263140 B1    5/2008

OTHER PUBLICATIONS

1 Chinese Office Action dated Feb. 1, 2023, issued in corresponding Chinese application.

*Primary Examiner* — Kinam Park
(74) *Attorney, Agent, or Firm* — Husch Blackwell LLP

(57) ABSTRACT

A driver circuit for laser diodes is provided with first and second terminals for the laser diodes. The driver circuit also includes capacitors, each being assigned to a laser diode, and at least one input for connection to a charging means. Further included is at least one input for a control signal and at least one first switch means. Each capacitor is connected to the input for connection to the charging means, and a first terminal of each capacitor is connected to the first terminal for the laser diode. The second terminal for the laser diode is connected to a first terminal of the at least one first switch means, and a second terminal of each capacitor is connected to ground. A second terminal of the at least one first switch means is connected to ground and wherein the at least one input for a control signal is connected to a control terminal of the at least one first switch means.

20 Claims, 1 Drawing Sheet

(51) Int. Cl.
*H01S 5/40* (2006.01)
*H01S 5/068* (2006.01)

(56) References Cited

U.S. PATENT DOCUMENTS

| | | | |
|---|---|---|---|
| 2007/0280314 A1* | 12/2007 | Keh | H01S 5/06808 |
| | | | 372/38.07 |
| 2009/0161710 A1* | 6/2009 | Hoashi | G01S 7/4815 |
| | | | 372/38.02 |
| 2017/0085057 A1* | 3/2017 | Barnes | H01S 5/0428 |
| 2018/0323576 A1* | 11/2018 | Crawford | H02M 1/088 |

* cited by examiner

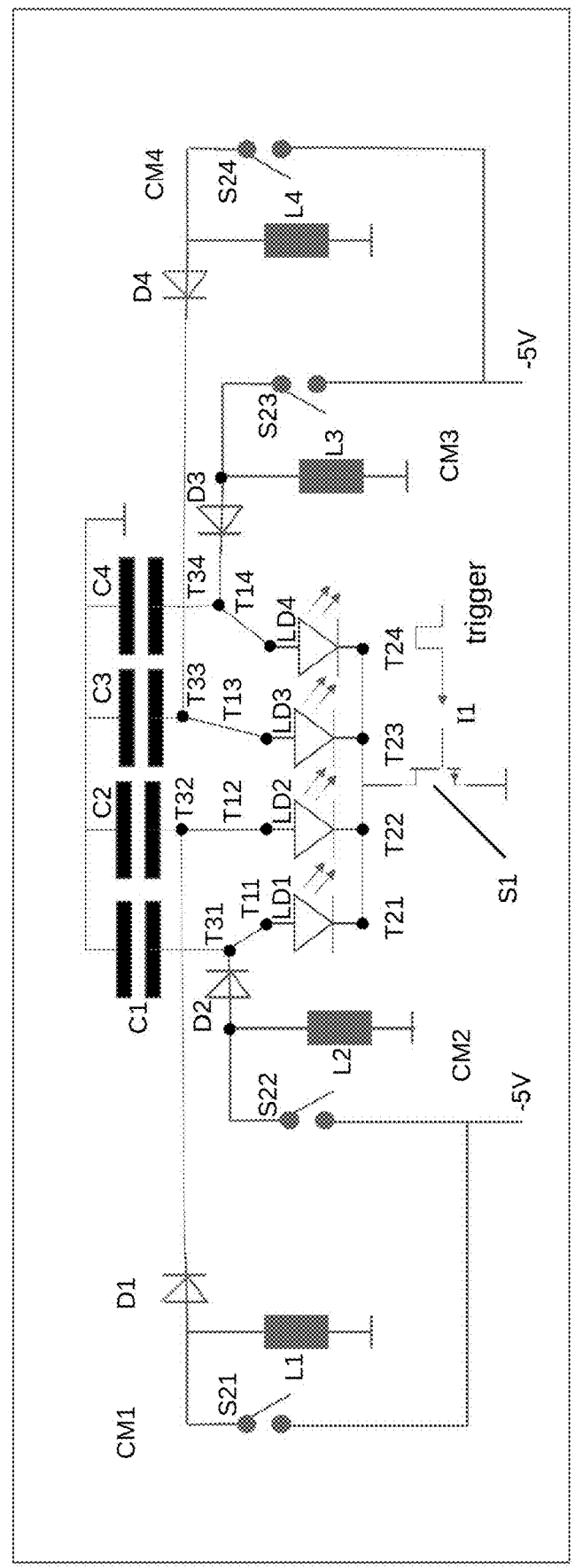

DRIVER CIRCUIT FOR LASER DIODES AND CIRCUIT ARRANGEMENT WITH SUCH A DRIVER CIRCUIT AND LASER DIODES

CROSS REFERENCE

This application claims priority to PCT Application No. PCT/EP2018/063131, filed May 18, 2018, the entirety of which is hereby incorporated by reference.

FIELD OF THE INVENTION

The invention concerns a driver circuit for laser diodes, with which laser diode pulse currents with a duration of a few nanoseconds can be generated.

BACKGROUND

A driver circuit is known from document EP 1 263 140 B1, in which a capacitor is charged by a charging medium. The capacitor is connected to a laser diode via a switch. When the switch is closed, the capacitor is discharged via the laser diode. The pulse current flowing through the laser diode causes the laser diode to emit a laser light pulse. The driver circuit is used in a system with which the distance to a moving object can be measured by laser. The applicant manufactures such a system under the name LIDAR.

The driver circuit known from the document EP 1 263 140 B1 requires some adjustments to meet the requirements and possibilities of the further developed technology.

It is therefore necessary for a driver circuit today to generate laser diode pulse currents in the single-digit nanosecond range. Furthermore, the generation of operating voltage must allow high pulse frequencies of several 100 kHz.

SUMMARY OF THE INVENTION

This is where this invention comes in.

The present invention was based on the problem of proposing a driver circuit adapted to today's requirements.

This problem is solved with a driver circuit according to claim 1. The driver circuit can be used in a circuit arrangement according to claim 8. The circuit arrangement may be operated in accordance with the method specified in claim 9.

A driver circuit according to the invention has
first and second terminals for the laser diodes,
capacitors, with a capacitor assigned to each first terminal for a laser diode,
at least one input for connection to a charging means,
at least one input for a control signal and
at least one first switch means, Each capacitor is connected to the input for connection to the charging means. A first terminal of each capacitor is connected to the first terminal for the laser diode. The second terminal for the laser diode is connected to a first terminal of the at least one first switch means. A second terminal of each capacitor is connected to ground. A second terminal of the at least one first switch means is connected to ground and the at least one input for a control signal is connected to a control terminal of the at least one switch means.

With the invention of the driver circuit it is possible to provide sufficiently high energy to generate the laser pulses at frequencies up to 500 kHz, whereby the energy is drawn from an on-board network of a motor vehicle, which often has a nominal voltage of 12 to 24 volts. It is possible to provide pulse currents of up to 40 A.

Tests have shown that a high efficiency can be achieved with an invented driver circuit. The power dissipation and heating of the driver circuit can thus be kept to a minimum.

A GaN-FET is preferably used as the first switching means instead of a Si-MOSFET, as this enables very fast switching.

A driver circuit according to the invention may have one only first switch means and all second terminals for the laser diodes are connected to the only first switch means. This makes it possible to discharge the capacitors charged via the charging means simultaneously by actuating the first switching means via the laser diodes and to generate the laser diode pulse currents.

Each first connection for a laser diode of such a driver circuit can be assigned an input for connection to the charging means, a first terminal of the input for connection to the charging means being connected to the first connection for a laser diode and the first connection of the capacitor. This means that each laser diode and each capacitor is assigned a charging device. The charging devices can be activated independently of each other to charge the capacitors. The charge quantity of each capacitor can also be adjusted independently of each other by the charging means.

The driver circuit may comprise charging means connected to each first terminal of the input for connection to the charging means and connected to ground. That means that the charging means may be part of the driver circuit.

The charging means may comprise a diode, which is connected with its cathode to the first terminal of the input for connection to the charging means. The diode may prevent that the capacitor is discharged by the charging means.

The charging means may comprise an inductor with a first terminal connected to the anode of the diode and a second terminal connected to ground. The anode of the diode and the first terminal of the inductor are connected via a second switch means with an input for voltage source. The inductor may be charged, when the second switch means is closed. The potential of the voltage source is chosen such that no current flows out of the charging device via the diode into the remaining driver circuit. The voltage from the voltage source drives a charging current that charges the inductor. When the second switch means is then opened, the inductor drives a current through the diode and capacitor, which discharges the inductor and charges the capacitor. Inductor and capacitor then act as a series resonant circuit. The diode prevents oscillation, so that the charge of the capacitor is not transported back into the inductor.

Instead of charging the capacitors via switches or distributing electric charges to the capacitors via a voltage source with fixed voltage supply, this is ensured by closing the second switch means of the charge means. If one of the second switch means remains open, the assigned condenser is not charged, i.e. it is not discharged when the first switching means closes. No current then flows through the assigned laser diode. With the second switching means multiplexing is possible without the need for an additional component in the power path for switching the high pulse currents, which are very important for achieving short pulse widths (short FDHM, Full Duration at Half Maximum). It is sufficient that one charging device is assigned to a capacitor and one laser diode, whereby different charging voltages at the capacitors can be individually adjusted with the charging devices if necessary.

A driver circuit according to the invention could be part of a circuit arrangement with laser diodes, each laser diode being connected to first and second terminals for the laser diodes of the driver circuit.

A method for generating laser pulses according the invention with such a circuit arrangement could comprise the following steps:
- activating at least one of the charging means for charging the capacitor connected to the activated charging means,
- closing the at least one first switch means, or the first switch means for discharging the capacitors charged via the laser diodes connected to the capacitor.

BRIEF DESCRIPTION OF THE DRAWINGS

Reference is now made more particularly to the drawings, which illustrate the best presently known mode of carrying out the invention and wherein similar reference characters indicate the same parts throughout the views.

FIG. 1 shows a schematic circuit diagram of a circuit arrangement according to the invention

DETAILED DESCRIPTION OF THE DRAWINGS

The circuit arrangement according to FIG. 1 is used to provide four laser diodes LD1, LD2, LD3, LD4 with electrical pulses so that they can emit laser beams to detect objects in front of a vehicle. The laser diodes LD1, LD2, LD3, LD4 are connected to a first terminal T11, T12, T13, T14 with their anodes and to a second terminal T21, T22, T23, T24 of a driver circuit for the laser diodes with their cathodes.

For each laser diode LD1, LD2, LD3, LD4, the driver circuit includes a capacitor C1, C2, C3, C4 and a charging means CM1, CM2, CM3, CM4 with which the capacitor C1, C2, C3, C4 can be charged. A first terminal of each capacitor C1, C2, C3, C4 is connected to the first terminal of the input for the laser diode assigned to the capacitor C1, C2, C3, C4. Besides this, the first terminal of each capacitor C1, C2, C3, C4 is connected to an input of the charging means CM1, CM2, CM3, CM4. A second terminal of each capacitor C1, C2, C3, C4 is connected to ground.

The second terminals T21, T22, T23, T24 are connected to a first switch S1. If the first switch S1 is closed it connects the second terminals T21, T22, T23, T24 and the cathodes of all laser diodes to ground. The first switch S1 has an input for control signal for triggering the first switch.

Each time the first switch S1 is closed, each capacitor C1, C2, C3, C4 charged by the assigned charging means CM1, CM2, CM3, CM4 is discharged via the assigned laser diode LD1, LD2, LD3, LD4. The discharge current of one of the capacitors C1, C2, C3, C4 leads to emitting a laser beam generated by the assigned laser diode LD1, LD2, LD3, LD4.

The charging means CM1, CM2, CM3, CM4 are operated independently from each other. That means charging capacitor C1 by charging means CM1 does not affect capacitor C2, C3 or C4. Charging of capacitor C2 does not affect capacitor C1, and so on.

Each charging means comprises an input connected to a voltage source, in the example it is a voltage source of −5 Volts relative to ground.

An inductor L1, L2, L3, L4 of each charging means can be charged with the voltage of the voltage source. Each inductor L1, L2, L3, L4 of each charging means is connected in series to a second switch S21, S22, S23, S24. The second switch S21, S22, S23, S24 of each charging device can be activated for closing when the inductor L1, L2, L3, L4 is to be charged. If the inductor has been charged when the second switch is closed, the inductor is discharged. A current flows to ground when the second switches S21, S22, S23, S24 are open via a diode D1, D2, D3, D4, the first terminal of the input for connection to the charging means T31, T32, T33, T34 and the capacitors C1, C2, C3, C4. The current flows until inductor L1, L2, L3, L4 is discharged and capacitor C1, C2, C3, C4 is charged. Diodes D1, D2, D3, D4 then prevent the capacitor C1, C2, C3, C4 from discharging via inductor L1, L2, L3, L4 afterwards, so there is no oscillation of energy between inductor L1, L2, L3, L4 and capacitor C1, C2, C3, C4.

The capacitor C1, C2, C3, C4 is discharged if the first switch S1 is closed, as described before.

The voltages at the capacitors C1, C2, C3, C3, C4 can be in the range 20V to 50V. These are common values for common triple-stack laser diodes with about 10V forward voltage at 30A forward current. With the invention, capacitor voltage at 50 V can currently reach about 40 A pulse current with an FDHM of 8.5 ns. This capacitor voltage is obtained from an existing −5 V voltage source, i.e. no additional power supply branch is required for the laser voltage supply. If a −5 V voltage source is not available, a separate step-up converter circuit for increasing the voltage from the on-board power supply voltage to the required operating voltage of 20V to 50V could also be necessary, for example. Due to the charging means of an inventive driver circuit with the described design, a high efficiency is possible, like the efficiency of a switching power supply of 90% and above. Therefore, the overall efficiency of the circuit is high, which is important for the "cold" operation of such pulse laser driver stages and for enabling high pulse frequencies up to 500 kHz of importance.

REFERENCE SIGN LIST

LD1, LD2, LD3, LD4 laser diodes
T11, T12, T13, T14 first terminal for the laser diodes
T21, T22, T23, T24 second terminal for the laser diodes
C1, C2, C3, C4 capacitor
S1 first switch
I1 input for a control signal
CM1, CM2, CM3, CM4 charging means
T31, T32, T33, T34 first terminal of the input for connection to the charging means
L1, L2, L3, L4 inductors of the charging means
S21, S22, S23, S24 switch means of the charging means

The invention claimed is:

1. A driver circuit for laser diodes, the driver circuit comprising:
   first and second terminals for the laser diodes,
   capacitors, each being assigned to a laser diode,
   at least one input for connection to a charging means, wherein the charging means comprises an input connected to a voltage source of −5V potential relative to ground,
   at least one input for a control signal,
   at least one first switch means,
   wherein each capacitor is connected to the input for connection to the charging means,
   wherein a first terminal of each capacitor is connected to the first terminal for the laser diode,
   wherein the second terminal for the laser diode is connected to a first terminal of the at least one first switch means, wherein a second terminal of each capacitor is connected to ground, wherein a second terminal of the at least one first switch means is connected to ground and wherein the at least one input for the control signal is connected to a control terminal of the at least one first switch means.

2. The driver circuit according to claim 1, wherein the driver circuit has one first switch means and all second terminals for the laser diodes are connected to the only first switch means.

3. The driver circuit according to claim 2, wherein each first terminal for a laser diode is assigned an input for connection to the charging means, a first terminal of the input for connection to the charging means being connected to the first terminal for a laser diode and the first terminal of the capacitor.

4. The driver circuit according to claim 3, wherein the driver circuit comprises charging means connected to each first terminal of the input for connection to the charging means and connected to ground.

5. The driver circuit according to claim 4, wherein the charging means comprises a diode, which is connected with its cathode to the first terminal of the input for connection to the charging means.

6. The driver circuit according to claim 5, wherein the charging means comprises an inductor with a first terminal connected to a anode of the diode and a second terminal connected to ground.

7. The driver circuit according to claim 6, wherein the anode of the diode and the first terminal of the inductor are connected via a second switch means with an input for the voltage source.

8. A circuit arrangement with a driver circuit according to claim 1, and with laser diodes, wherein each laser diode is connected to first and second terminals for the laser diodes of the driver circuit.

9. A method for generating laser pulses using the driver circuit of claim 1, the method comprising the following steps:
   activating at least one of the charging means for charging the capacitor connected to the activated charging means;
   individually adjusting different charge voltages at each of the capacitors associated with each activated charging means; and
   closing the at least one first switch means, or the first switch means for discharging the capacitors charged via the laser diodes connected to the capacitor.

10. A driver circuit for laser diodes, the driver circuit comprising:
   first and second terminals for the laser diodes,
   capacitors, each being assigned to a laser diode,
   at least one input for connection to a charging means,
   at least one input for a control signal,
   at least one first switch means,
   wherein each capacitor is connected to the input for connection to the charging means,
   wherein a first terminal of each capacitor is connected to the first terminal for the laser diode,
   wherein the second terminal for the laser diode is connected to a first terminal of the at least one first switch means,
   wherein a second terminal of each capacitor is connected to ground,
   wherein a voltage at each capacitor is in a range of 20V to 50V,
   wherein a second terminal of the at least one first switch means is connected to ground and
   wherein the at least one input for the control signal is connected to a control terminal of the at least one first switch means.

11. The driver circuit according to claim 10, wherein the driver circuit has one first switch means and all second terminals for the laser diodes are connected to the only first switch means.

12. The driver circuit according to claim 10, wherein each first terminal for a laser diode is assigned an input for connection to the charging means, a first terminal of the input for connection to the charging means being connected to the first terminal for a laser diode and the first terminal of the capacitor.

13. The driver circuit according to claim 10, wherein the driver circuit comprises charging means connected to each first terminal of the input for connection to the charging means and connected to ground.

14. The driver circuit according to claim 10, wherein the charging means comprises a diode, which is connected with its cathode to the first terminal of the input for connection to the charging means.

15. The driver circuit according to claim 14, wherein the charging means comprises an inductor with a first terminal connected to an anode of the diode and a second terminal connected to ground.

16. The driver circuit according to claim 15, wherein the anode of the diode and the first terminal of the inductor are connected via a second switch means with an input for voltage source.

17. A circuit arrangement with a driver circuit according to claim 10, and with laser diodes, wherein each laser diode is connected to first and second terminals for the laser diodes of the driver circuit.

18. The driver circuit according to claim 10, wherein the charging means comprises an input connected to a voltage source of −5V potential relative to ground.

19. The driver circuit according to claim 10, wherein the voltage at the capacitor at 50V can reach an approximate pulse current of 40 A.

20. The driver circuit according to claim 19, wherein the voltage at the capacitor further comprises a full duration half maximum (FHDM) of 8.5 ns.

* * * * *